United States Patent
Lee (10) Patent No.: US 8,059,250 B2
(45) Date of Patent: Nov. 15, 2011

(54) LIQUID CRYSTAL DISPLAY AND FABRICATING METHOD THEREOF

(75) Inventor: Woo Chang Lee, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/164,425

(22) Filed: Jun. 20, 2011

(65) Prior Publication Data

US 2011/0244752 A1 Oct. 6, 2011

Related U.S. Application Data

(62) Division of application No. 11/987,393, filed on Nov. 29, 2007, now Pat. No. 7,982,844.

(30) Foreign Application Priority Data

Dec. 27, 2006 (KR) .................. 10-2006-0134510

(51) Int. Cl.
  *G02F 1/1345* (2006.01)
(52) U.S. Cl. ......... 349/151; 349/138; 349/149; 349/152
(58) Field of Classification Search .................. 349/151
  See application file for complete search history.

(56) References Cited

U.S. PATENT DOCUMENTS

| 6,198,519 | B1 | 3/2001 | Chang |
| 6,518,557 | B1 | 2/2003 | Izumi et al. |
| 7,012,814 | B2 | 3/2006 | Sugimoto et al. |
| 7,136,133 | B2 | 11/2006 | Murai |
| 2004/0195574 | A1 | 10/2004 | Ahn et al. |
| 2004/0262035 | A1 | 12/2004 | Ko et al. |
| 2005/0099565 | A1 | 5/2005 | Shin et al. |

FOREIGN PATENT DOCUMENTS

| JP | 11-024588 | 1/1999 |
| JP | 2006-276362 | 10/2006 |

*Primary Examiner* — Richard Kim

(74) *Attorney, Agent, or Firm* — McKenna Long & Aldridge, LLP (57) ABSTRACT

A liquid crystal display device includes: a liquid crystal display panel having a plurality of data lines and a plurality of gate lines crossing each other; a data drive circuit which supplies data voltages to the data lines; a gate drive circuit which supplies scan pulses to the gate lines; and first dummy pads on a substrate of the liquid crystal display panel at both sides of the data drive circuit, and wherein the data drive circuit is joined onto the substrate with a first anisotropic conductive film and both sides of the first anisotropic conductive film are joined to the first dummy pads.

5 Claims, 10 Drawing Sheets

LIQUID CRYSTAL DISPLAY AND FABRICATING METHOD THEREOF

This application is a Divisional of application Ser. No. 11/987,393 filed Nov. 29, 2007, now U.S. Pat. No. 7,982,844, which claims priority to Korean Patent Application No. 10-2006-0134510, filed Dec. 27, 2006, each of which are incorporated by reference in their entirety for all purposes as if fully set forth herein.

BACKGROUND OF THE INVENTION

1. Field of the Invention

The present invention relates to a liquid crystal display device, and more particularly to a chip-on-glass type liquid crystal display device and the fabricating method thereof that is adaptive for preventing a joint defect of an anisotropic conductive film.

2. Description of the Related Art

A liquid crystal display device controls the light transmittance of a liquid crystal in use of an electric field, thereby displaying a picture. To this end, the liquid crystal display device includes a liquid crystal display panel where liquid crystal cells are arranged in a matrix pattern; and a drive circuit for driving the liquid crystal display panel.

In the liquid crystal display panel, gate lines and data lines are arranged to cross each other, and liquid crystal cells are located in areas provided by the crossing of the gate lines and the data lines.

The drive circuit includes a gate driver for driving the gate lines and a data driver for driving the data lines.

Each of the gate driver and the data driver includes a plurality of drive integrated circuits (hereinafter, referred to as "IC"). Each of the data drive IC and the gate drive IC is mounted on the liquid crystal display panel by a chip-on-glass (hereinafter, referred to as "COG") method in a small and medium size liquid crystal display device, as in FIG. 1.

The COG process is explained centering on the data drive IC as follows.

Figure 1:
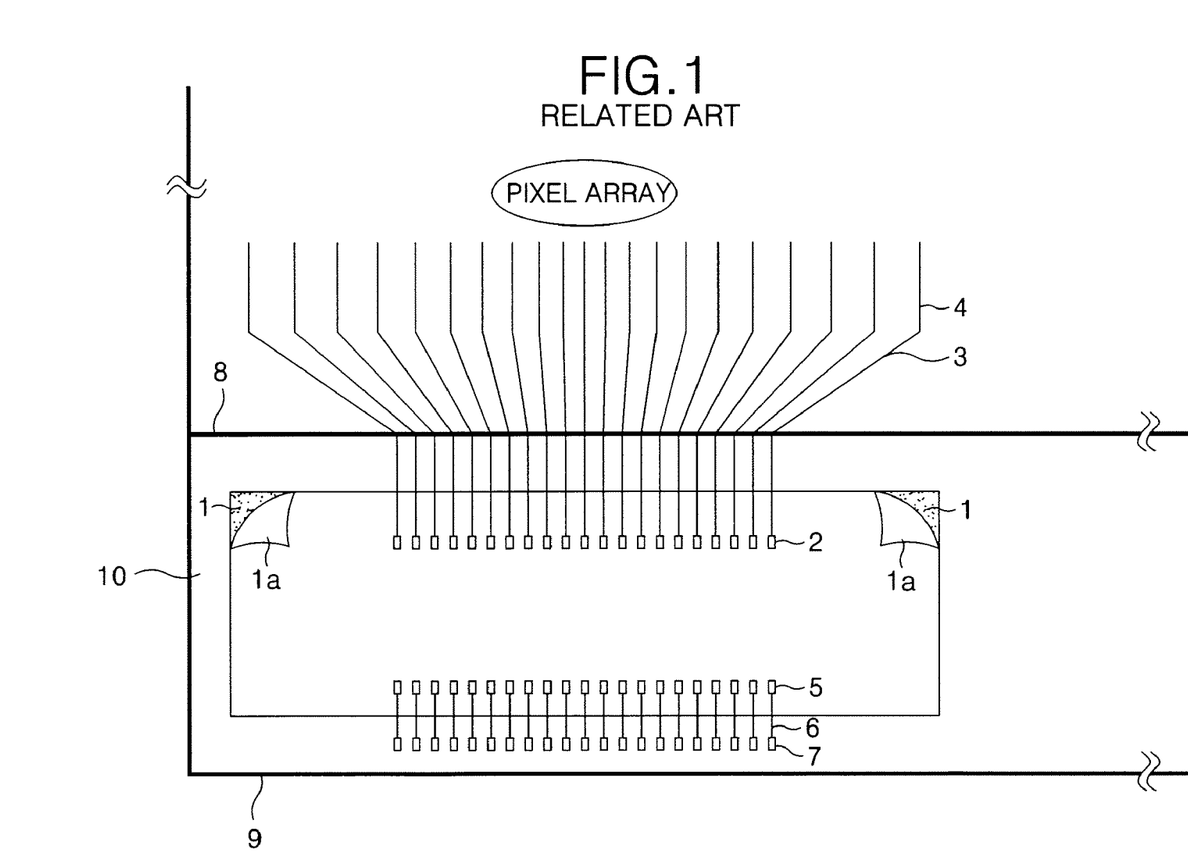
FIGS. 1 and 2 are views for explaining a chip-on-glass process of the related art.
Figure 2:
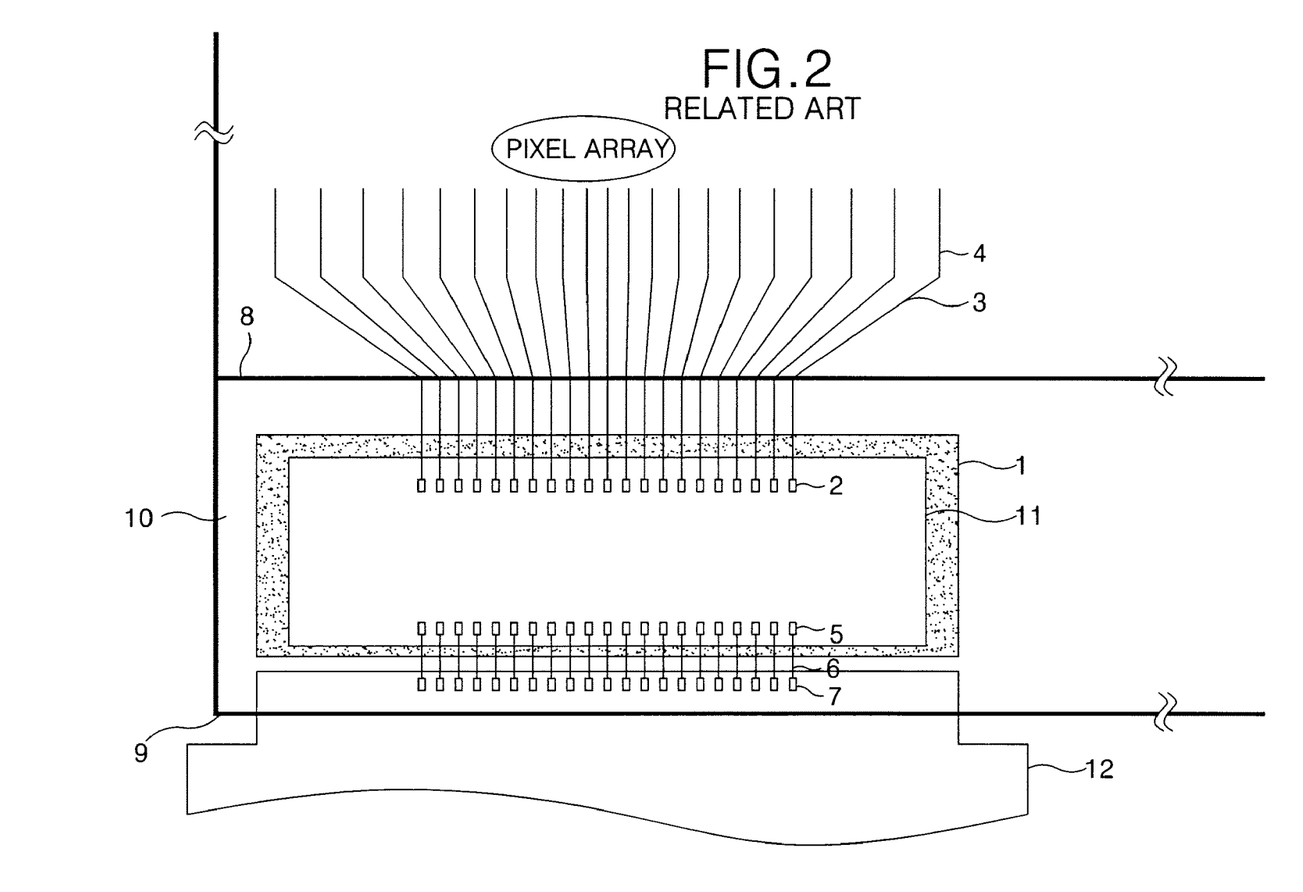

Referring to FIGS. 1 and 2, a lower glass substrate 9 includes a data line 4; a data link 3 connected to the data line 4; a data pad 2 formed at an end of the data link 3; an FPC connection line 6; and first and second FPC connection pads 5, 7 formed at both ends of the FPC connection line 6. The lower glass substrate 9 is bonded with an upper glass substrate 8, in which a color filter and a black matrix are formed, in use of a sealant.

The COG process includes a process of temporarily pressing an anisotropic conductive film (hereinafter, referred to as "ACF") 1 onto the lower glass substrate 9, as in FIG. 1; and a process of permanently pressing the data drive IC onto the ACF 1 in use of a heat pressure process, as in FIG. 2.

The temporary pressure process joins the ACF 1 to a non-display surface 10 the edge of the lower glass substrate 9 so as to sufficiently cover the data pads 2, parts of the gate links 3, the first FPC connection pads 5 and parts of the FPC connection lines 6, which are disposed in the non-display surface 10 of the edge of the lower glass substrate 9 that are not overlapped with the upper glass substrate 8, and then temporarily pressing thereonto, as in FIG. 1. The ACF 1 is covered by a protection sheet 1a.

The permanent pressure process peels off the protection sheet 1a from the ACF 1 after cutting the ACF 1 covered by the protection sheet 1a, as in FIG. 1, and then aligns output bumps of the data drive IC 11 to the data pads 2 and aligns input bumps of the data drive IC 11 to the first FPC connection pads 5 as in FIG. 2. And, the permanent pressure process applies heat to the ACF 1 by a heat pressure process using a bonding head and simultaneously press the data drive IC 11 onto the lower glass substrate 9, thereby completely bonding the data drive IC 11 onto the lower glass substrate 9.

Figure 3:
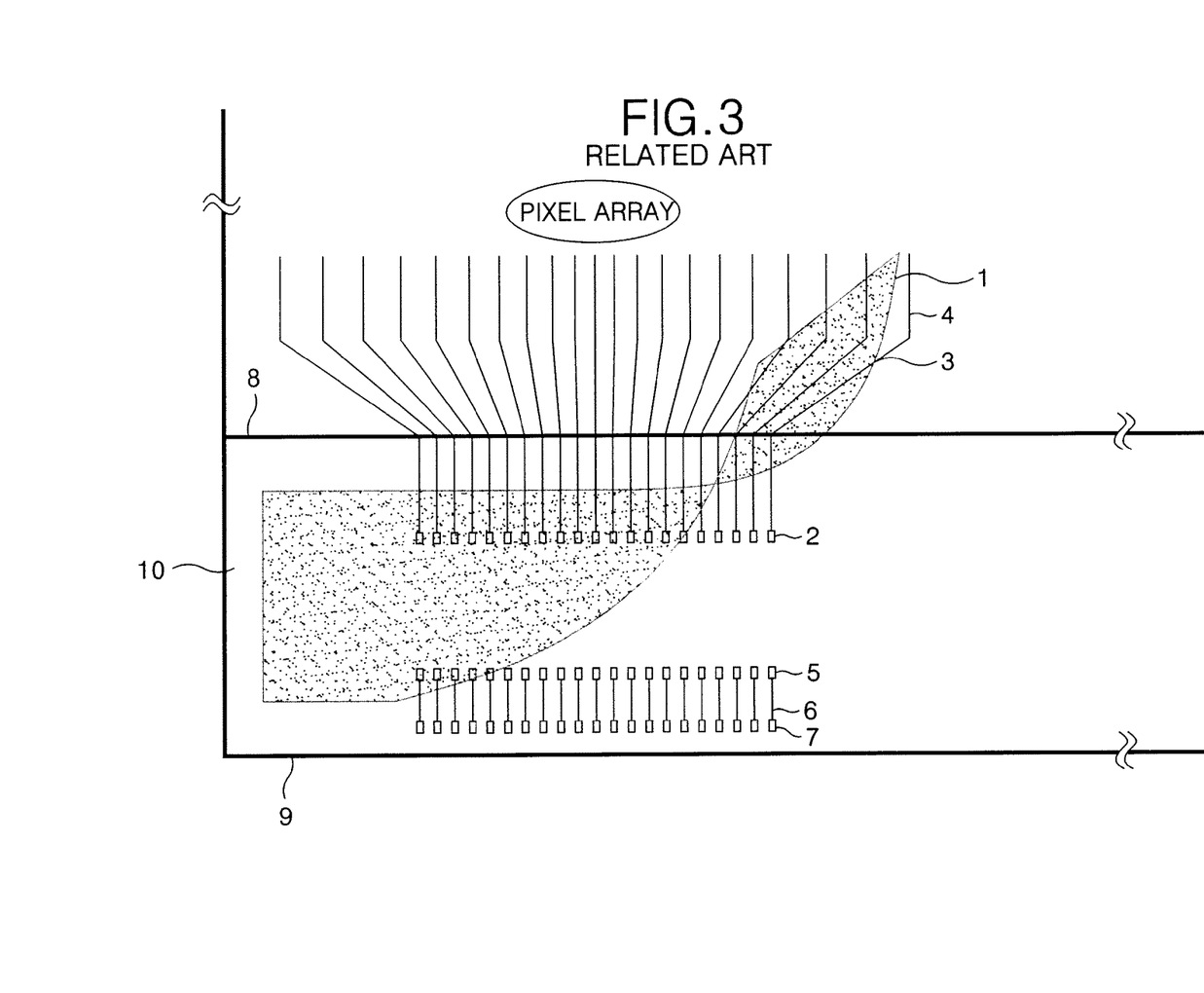
FIG. 3 is a diagram representing a joint defect of an anisotropic conductive film in the chip-on-glass process of the related art.

And, the ACF 1 has a characteristic of being badly joined with glass, thus the ACF 1 is peeled off along with the protection sheet 1a, as in FIG. 3, when the protection sheet 1a is peeled off from the ACF 1 which is joined to the lower glass substrate 9 in the temporary pressure process. And, as a result thereof, there is generated a joint defect of the data drive IC because of being stuck to other part than the joint part of the data drive IC.

SUMMARY OF THE INVENTION

Accordingly, the present invention is directed to a liquid crystal display device and the fabricating method thereof that is adaptive for preventing a joint defect of an ACF that substantially obviates one or more of the problems due to limitations and disadvantages of the related art.

In order to achieve these and other objects of the invention, a liquid crystal display device according to an aspect of the present invention includes a liquid crystal display panel having a plurality of data lines and a plurality of gate lines which cross each other; a data drive circuit which supplies data voltages to the data lines; a gate drive circuit which supplies scan pulses to the gate lines; and first dummy pads which are disposed on a substrate of the liquid crystal display panel at both sides of the data drive circuit, and the data drive circuit is joined onto the substrate with a first anisotropic conductive film and both sides of the first anisotropic conductive film are joined to the first dummy pads.

The liquid crystal display device further includes second dummy pads which are disposed on the substrate of the liquid crystal display panel at both sides of the gate drive circuit, and the gate drive circuit is joined onto the substrate with a second anisotropic conductive film and both sides of the second anisotropic conductive film are joined to the second dummy pads.

In the liquid crystal display device, the dummy pads include the same metal as the data line.

In the liquid crystal display device, the dummy pads include at least any one of molybdenum Mo, titanium Ti and tantalum Ta.

In the liquid crystal display device, a height of the dummy pad is not less than a height of the anisotropic conductive film.

A fabricating method of a liquid crystal display device according to another aspect of the present invention includes: forming a plurality of gate lines on a substrate; forming an insulating layer on the gate lines; forming a plurality of data lines which cross the gate lines and simultaneously forming first dummy pads, which are disposed on both sides of a joint part of a first drive circuit, on the insulating layer; joining a first anisotropic conductive film to the first dummy pads and a joint part of the first drive circuit; and heat-pressing a data drive circuit, which supplies data voltages to the data lines, onto the first anisotropic conductive film.

The fabricating method further includes: forming second dummy pads, which are disposed on both sides of a joint part of a second drive circuit, on the insulating layer; joining a second anisotropic conductive film to the second dummy pads and a joint part of the second drive circuit; and heat-pressing a gate drive circuit, which supplies scan pulses to the gate lines, onto the second anisotropic conductive film.

In the fabricating method, the dummy pads include the same metal as the data line.

In the fabricating method, the dummy pads include at least any one of molybdenum Mo, titanium Ti and tantalum Ta.

In the fabricating method, a height of the dummy pad is not less than a height of the anisotropic conductive film.

BRIEF DESCRIPTION OF THE DRAWINGS

These and other objects of the invention will be apparent from the following detailed description of the embodiments of the present invention with reference to the accompanying drawings, in which.

DETAILED DESCRIPTION OF THE ILLUSTRATED EMBODIMENTS

Reference will now be made in detail to the preferred embodiments of the present invention, examples of which are illustrated in the accompanying drawings.

With reference to FIGS. 4 to 7D, embodiments of the present invention will be explained as follows.

Figure 4:
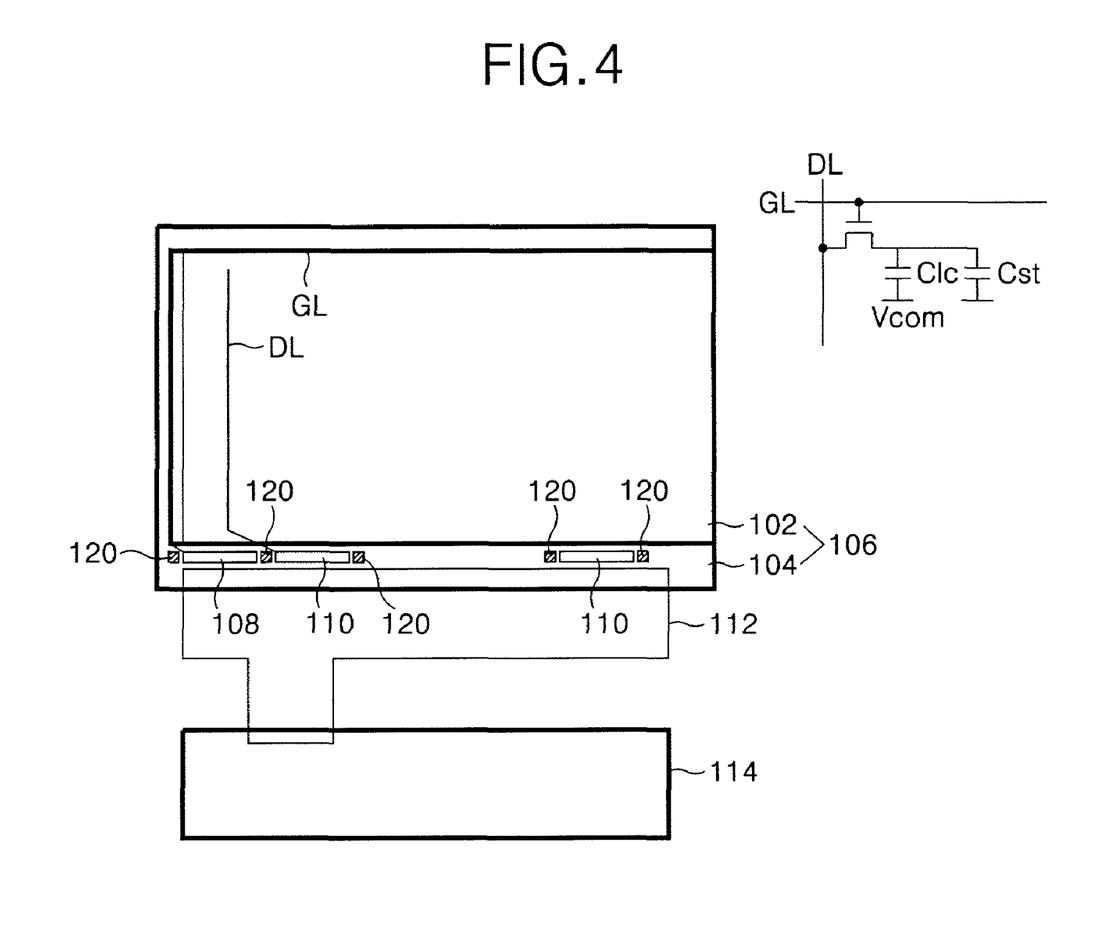
FIG. 4 is a diagram representing a liquid crystal display device according to an embodiment of the present invention.
Figure 5:
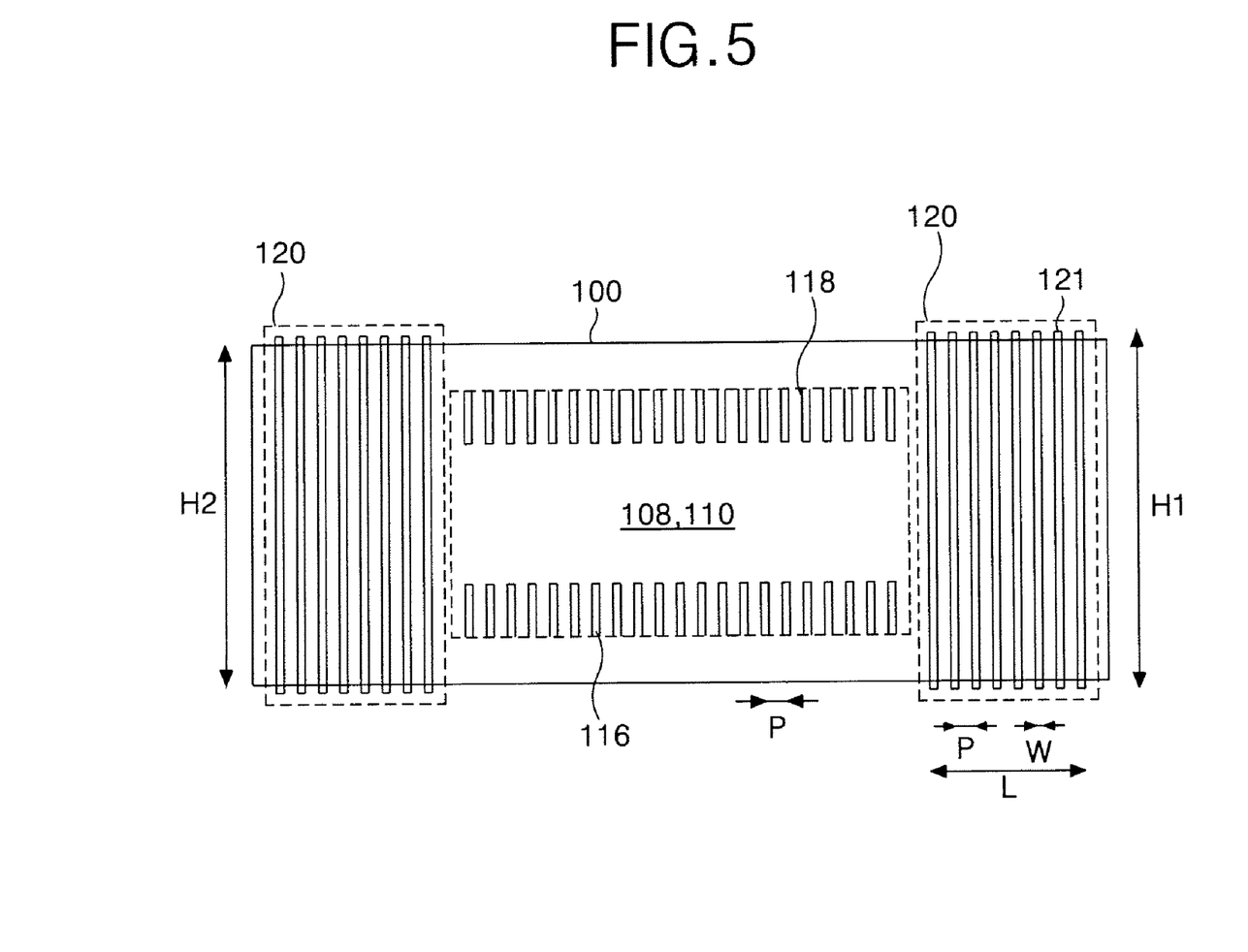
FIG. 5 is a plan view enlarging a dummy pad group shown in FIG. 4.

Referring to FIGS. 4 and 5, a liquid crystal display device according to an embodiment of the present invention includes a liquid crystal display panel 106; a gate drive IC 108 and a data drive IC 110 which are joined to a non-display surface of the liquid crystal display panel 106, to be parallel to each other; a dummy pad group 120 disposed on both sides of the gate and data drive ICs 108, 110; and an FPC 112 connected between the liquid crystal display panel 106 and the PCB 114.

The upper glass substrate 102 and the lower glass substrate 104 of the liquid crystal display panel 106 are joined with a sealant.

On the lower glass substrate 104, a plurality of data lines DL and a plurality of gate lines GL are formed to cross each other, and liquid crystal cells Clc are disposed in a matrix pattern in cell areas defined by the data lines DL and gate lines GL. A data link is connected to the data line DL, and a data pad electrically connected to output bumps of the data drive IC 110 is formed at the end of the data link. A gate link is connected to the gate line GL, and a gate pad electrically connected to output bumps of the gate drive IC 108 is formed at the end of the gate link.

A thin film transistor TFT formed at the crossing part of the data line DL and gate line GL supplies data voltages from the data line DL to the liquid crystal cell Clc in response to scan pulses from the gate line GL. To this end, a gate electrode of the TFT is connected to the gate line GL and a source electrode thereof is connected to the data line DL. A drain electrode of the TFT is connected to a pixel electrode of the liquid crystal cell Clc. Common voltages Vcom are supplied to a common electrode which faces the pixel electrode.

The upper glass substrate 102 includes a black matrix formed between the adjacent liquid crystal cells Clc to define cell areas; and R, G and B color filters for realizing colors.

The common electrode facing the pixel electrode of the liquid crystal cell Clc is faulted on the upper glass substrate 102 in a vertical electric field drive method such as a TN (twisted nematic) mode and a VA (vertical alignment) mode. And, the common electrode is formed on the lower glass substrate 104 together with the pixel electrode in a horizontal electric field drive method such as an IPS (in-plane switching) mode and an FFS (fringe field switching) mode.

The numerical reference 'Cst' is a storage capacitor. The storage capacitor Cst can be formed by the overlapping of the gate line GL and the pixel electrode of the liquid crystal cell Clc. Further, the storage capacitor Cst can be formed by the overlapping of a separate common line and the pixel electrode.

The data drive IC 110 converts digital video data inputted from the PCB 114 through the FPC 112 into positive/negative analog gamma compensation voltages under control of a timing controller mounted on the PCB, and supplies the analog gamma compensation voltages as analog data voltages to the data lines DL.

The gate drive IC 108 sequentially supplies the scan pulses to the gate lines 102 in accordance with gate control signals supplied from the PCB 114 through the FPC 112.

The dummy pad group 120 may be formed of the same metal as a source/drain metal pattern such as the source/drain electrodes of the TFT, the data line, the data pad and the like at the same time as the source/drain metal pattern, as described in the following fabrication process. The metals used as the source/drain metal pattern has a characteristic of being well stuck to the ACF. Accordingly, the dummy pattern group 120 acts to firmly join both sides of the ACF.

The dummy pad group 120 is desirably formed for a length L thereof to be as long as possible in a horizontal direction, as shown in FIG. 5, and a height H1 of the dummy pad 121 should be higher than a height H2 of the ACF 100. A width W of the dummy pad 121 can be the same as or different from widths of the input and output pads of the gate and data drive ICs 108, 110. A pitch P between the dummy pads 121 can be the same as or different from pitches of the input and output pads of the gate and data drive ICs 108, 110.

On the PCB 114 are mounted a DC-DC converter which generates drive voltages required for the data drive IC 110 and the gate drive IC 108, the common voltages Vcom and the like; and a timing controller which controls an operation timing of the drive ICs 110, 108.

Figure 6:
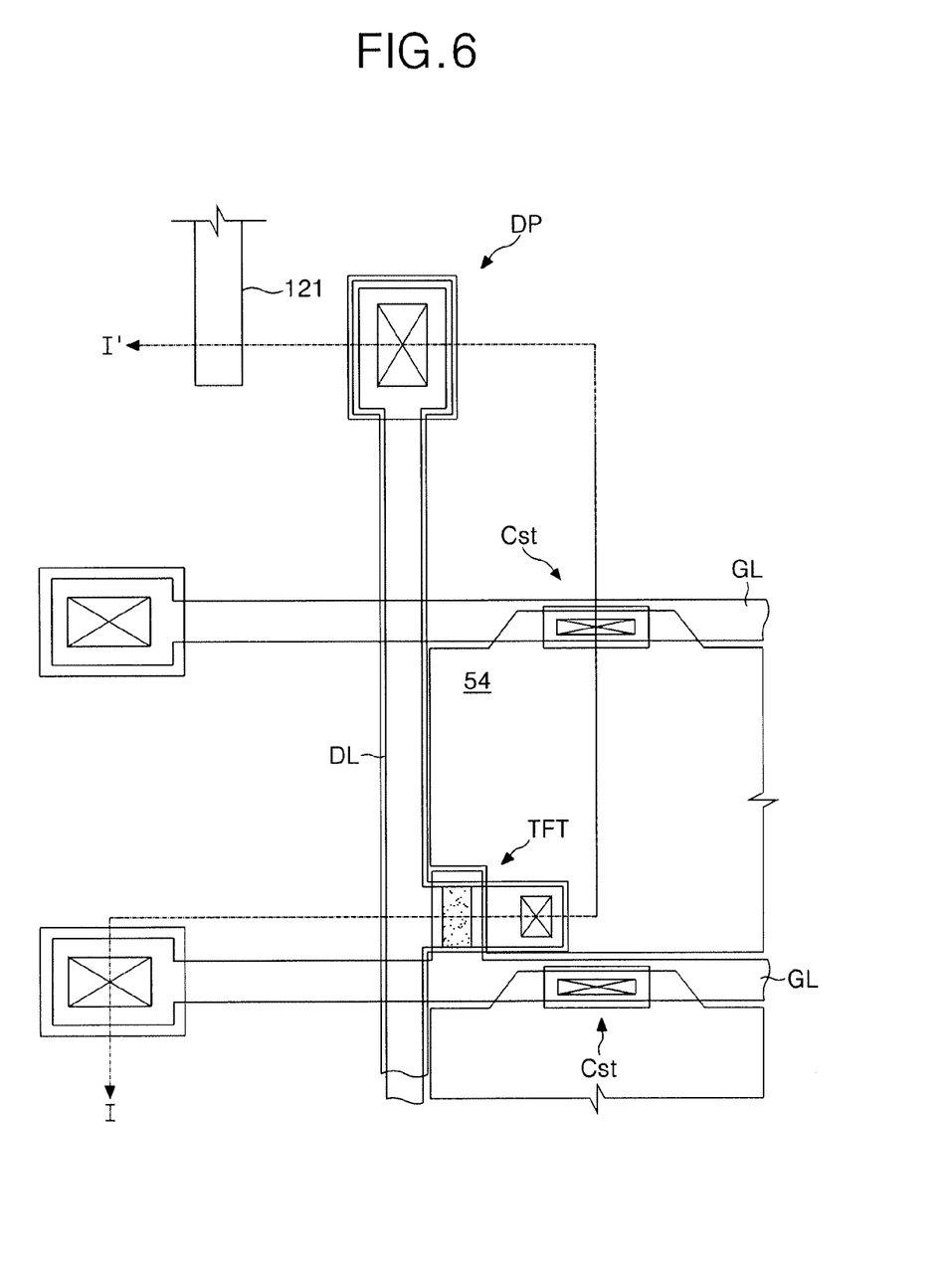
FIG. 6 is a plan view representing a part of a TFT array formed in a lower glass substrate in the liquid crystal display device according to the embodiment of the present invention.
Figure 7A:
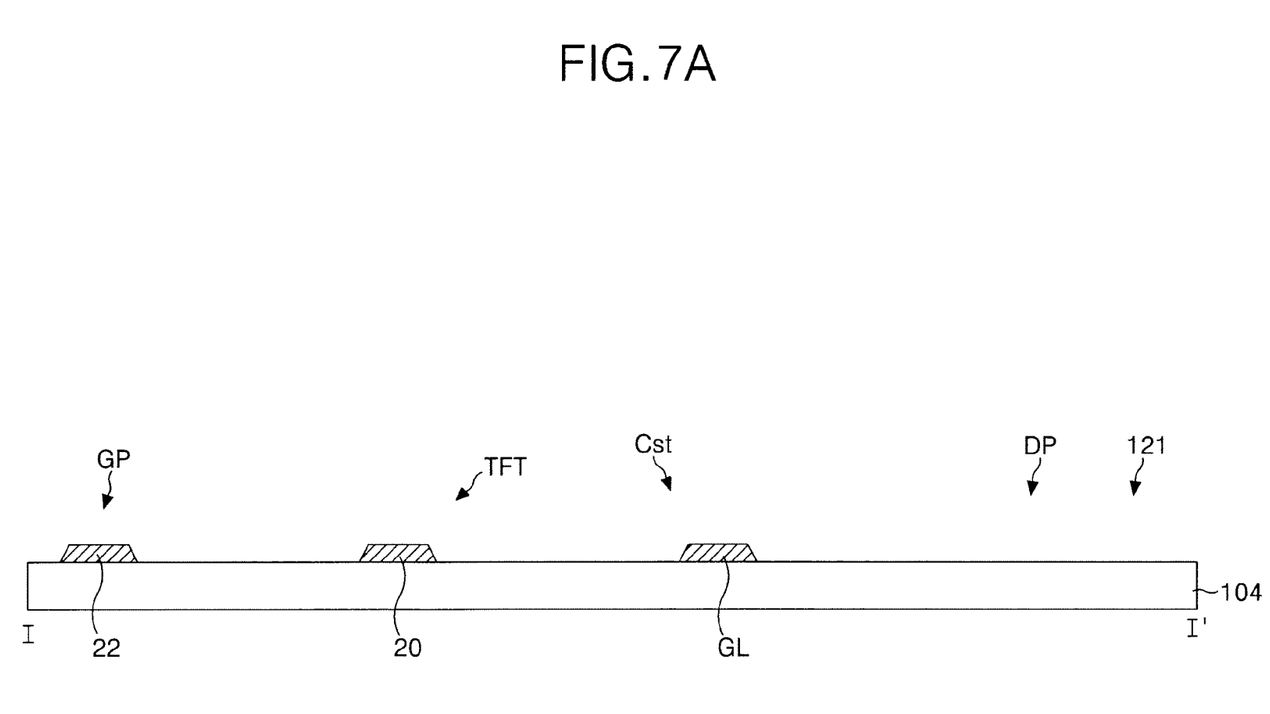
FIGS. 7A to 7D are cross sectional diagrams for explaining a fabricating process of a lower plate of the liquid crystal display device taken along the line I-I' in FIG. 6, step by step.
Figure 7B:
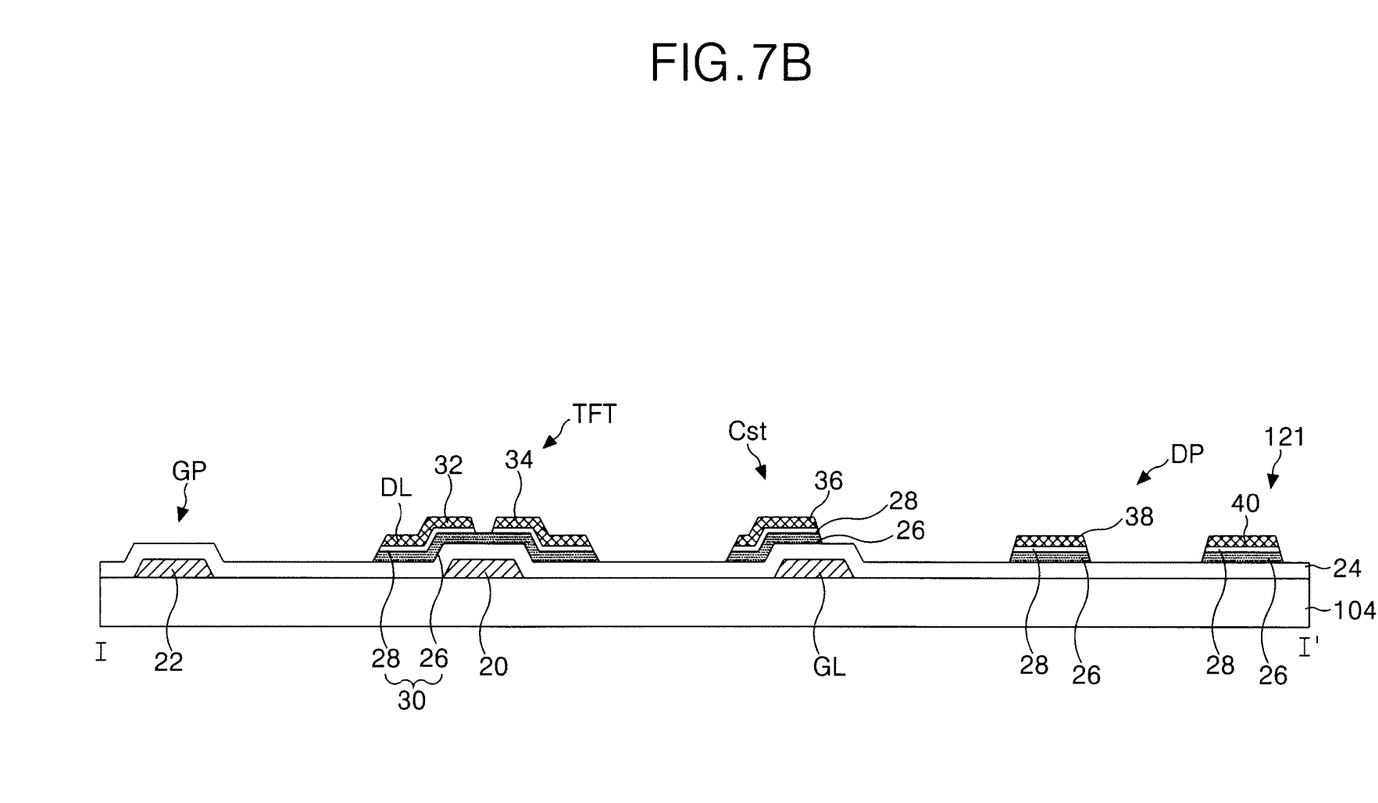
Figure 7C:
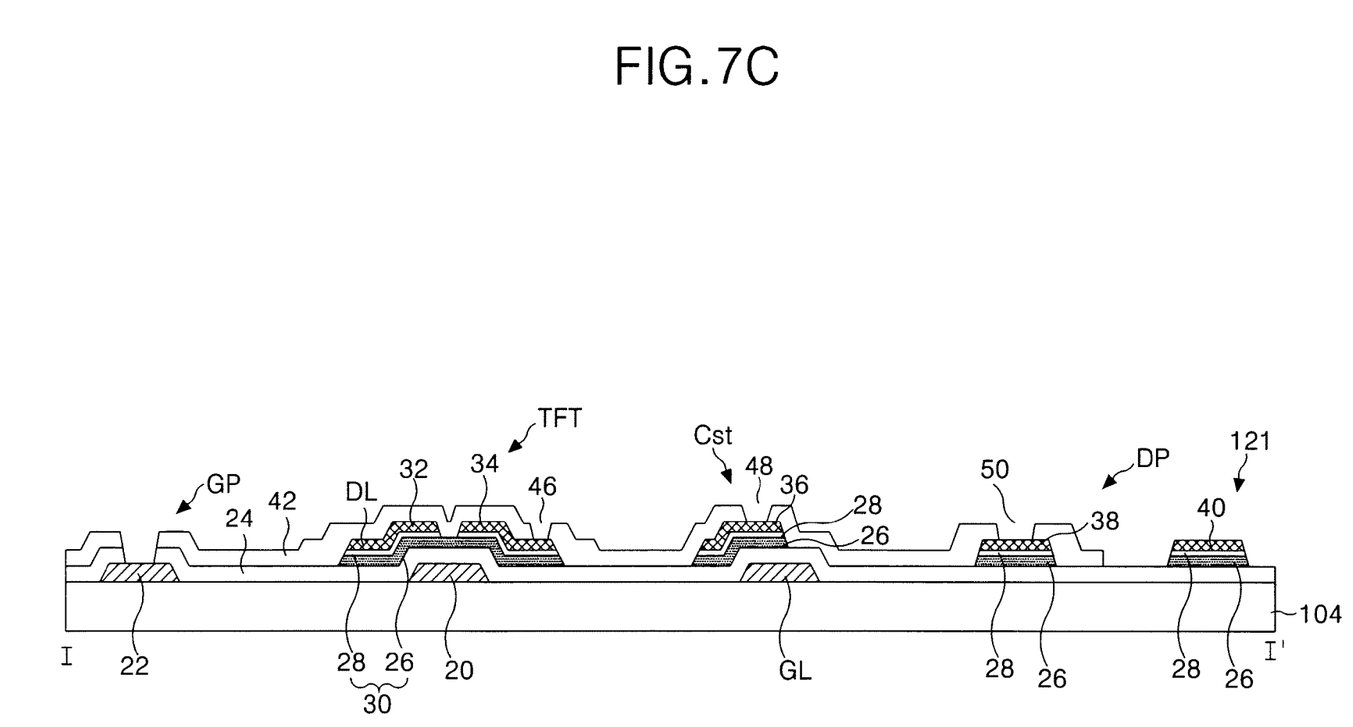
Figure 7D:
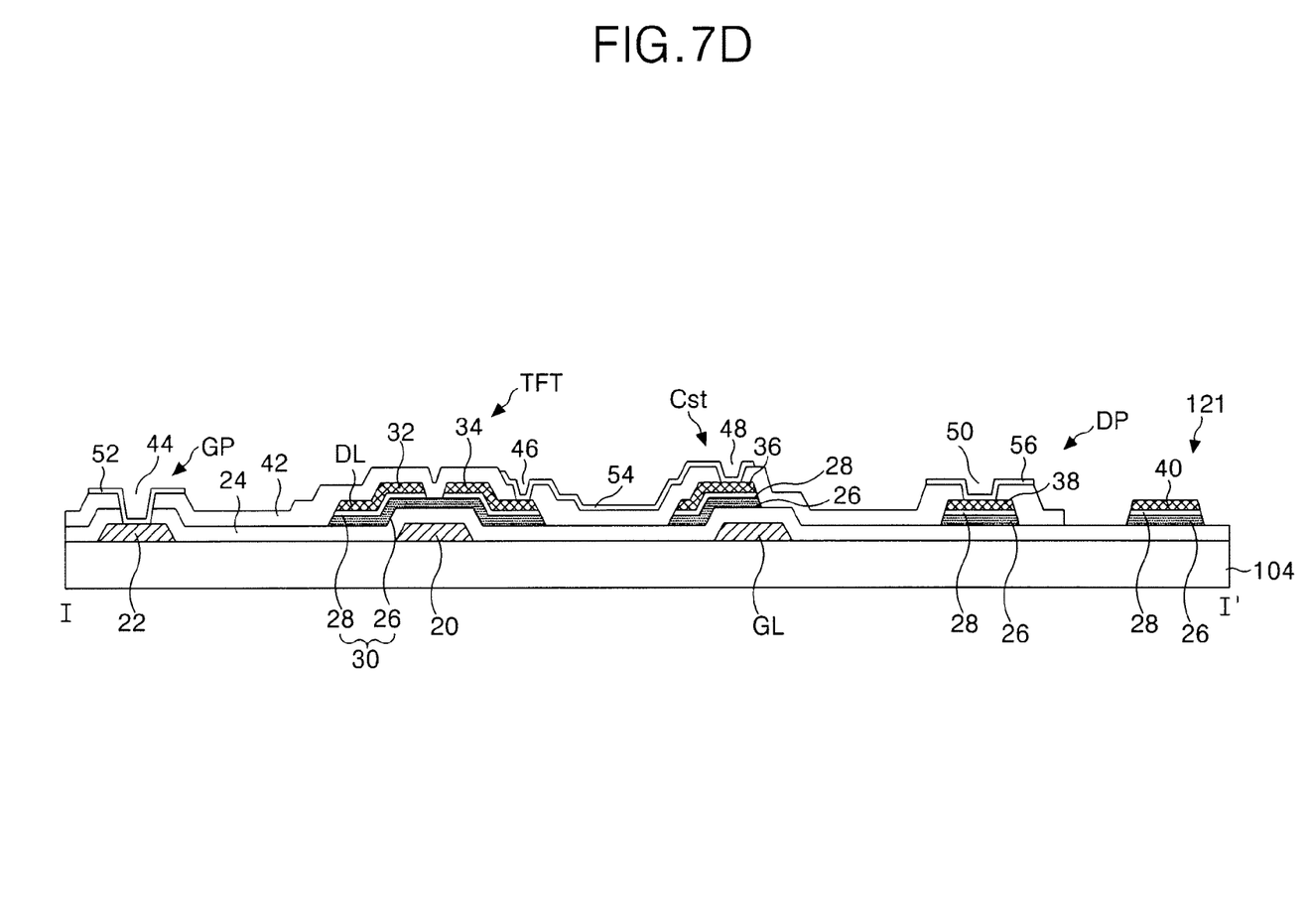

FIGS. 6 to 7D are a plan view and cross sectional views for explaining a fabrication process of a lower plate of the liquid crystal display device according to an embodiment of the present invention, step by step.

Firstly, as in FIG. 7A, on the lower glass substrate 104 are formed gate metal patterns of a gate metal layer which includes a single layer or double layer of chrome Cr, molybdenum Mo, aluminum group metal and the like. The gate metal layer is formed on the lower glass substrate 104 by a deposition method such as a sputtering method and the like, and the gate metal layer is patterned by a photolithography process using a first mask and an etching process. The gate metal pattern includes a gate line GL, a gate electrode 20 of the TFT and a gate pad lower electrode 22.

Subsequently, a gate insulating film 24, an active layer 26, an ohmic contact layer 28 and source/drain metal patterns are formed on the lower glass substrate 104 where the gate metal pattern is formed, as in FIG. 7B. To describe this process step by step, the gate insulating film 24, an amorphous silicon layer, an n+ amorphous silicon layer and a source/drain metal layer are sequentially form on the lower glass substrate 104 where the gate metal patterns are formed, by deposition methods such as PECVD, sputtering and the like. An inorganic insulating material such as silicon oxide SiOx, silicon nitride SiNx or the like might be selected as the gate insulating film 24. And, molybdenum Mo, titanium Ti, tantalum Ta, molybdenum Mo alloy and the like might be selected as the source/drain metal layer. Subsequently, a photo-resist pattern is formed on the source/drain metal layer by a photolithography process using a second mask. The second mask uses a diffractive exposure mask having a diffractive exposure part in a channel part of the TFT so as to make the exposure amount of the photo-resist pattern of the channel part less than that of the photo-resist pattern located in other part, thereby making the thickness of the photo-resist pattern of the channel part thinner after a stripping process. The source/drain metal layer is patterned by a wet etching process using the photo-resist pattern to form the data line DL, the source electrode 32, the drain electrode 34 connected to the source electrode 32, the storage electrode 36 and the dummy pads 121 to which the ACF 100 is to be joined. And then, the n+ amorphous silicon layer and the amorphous silicon layer are simultaneously etched by a dry etching process using the same photo-resist pattern to pattern the ohmic contact layer 28 and the active layer 26, and then, etches the source/drain patterns and the ohmic contact layer 28 in the channel part of the TFT by the dry etching process after removing the photo-resist pattern having a relatively low height at the channel part of the TFT by an ashing process. A result thereof, the active layer 26 is exposed at the channel part, and the source electrode 32 and the drain electrode 34 are separated from each other. Subsequently, the photo-resist pattern is removed by the stripping process. The edges of the source/drain metal pattern and a semiconductor pattern 30 inclusive of the active layer 26 and the ohmic contact layer 28 are located on the same line by such processes.

On the other hand, the fabrication process of the lower plate of the liquid crystal display device according to the embodiment of the present invention might divide the mask process into a mask process for forming the semiconductor pattern 30 and a mask process for forming the source/drain pattern, differently from the fabrication process of FIG. 7B. That is to say, another embodiment of the present invention sequentially forms an amorphous silicon layer, an n+ amorphous silicon layer and an active layer on the lower glass substrate 104 where the gate metal pattern is formed. And, the semiconductor layer is patterned by a photolithography process using a mask and an etching process to pattern the active layer 26 and the ohmic contact layer 28, and then, the source/drain metal layer is formed on the semiconductor pattern 30 to pattern the source/drain metal pattern by a photolithography process using another mask and an etching process.

Referring to FIG. 7C, a passivation film 42 inclusive of first to fourth contact holes 44, 46, 48, 50 is formed on the gate insulating film 24 where the source/drain patterns are formed.

The passivation film 42 is deposited on the entire surface of the gate insulating film 24 where the source/drain metal patterns are formed, by a deposition method such as PECVD and the like. The passivation film 42 is patterned by a photolithography process using a third mask and an etching process to form the first to fourth contact holes 44, 46, 48, 50. The passivation film 42 by which the dummy pads 121 are covered is simultaneously removed. The first contact hole 44 penetrates the passivation film 42 and the gate insulating film 24 to expose the gate pad lower electrode 22, and the second contact hole 46 penetrates the passivation film 42 to expose the drain electrode 34 of the TFT. The third contact hole 48 penetrates the passivation film 42 to expose the storage electrode 36, and the fourth contact hole 50 penetrates the passivation film 42 to expose the data pad lower electrode 38. An inorganic insulating material such as the gate insulating film 24, or an organic insulating material such as an acrylic group organic compound with low dielectric constant, BCB, PFCB or the like is used as the passivation film 42.

Referring to FIG. 7D, a transparent electrode material is deposited on the entire surface of the passivation film 42 by the deposition method such as sputtering and the like. The transparent electrode material is ITO (indium tin oxide), TO (tin oxide) or IZO (indium zinc oxide). Subsequently, the transparent electrode material is patterned by a photolithography process using a fourth mask and an etching process to form transparent electrode patterns inclusive of the pixel electrode 54, the gate pad upper electrode 52 and the data pad upper electrode 56. The transparent electrode might be formed in the dummy pad 121 at the same time. The pixel electrode 54 is connected to the drain electrode 34 of the TFT through the second contact hole 46, and to the storage electrode 36, which overlaps the pre-stage gate line, through the third contact hole 48. The gate pad upper electrode 52 is connected to the gate pad lower electrode 22 through the first contact hole 44 and to the data pad lower electrode 38 through the fourth contact hole 50.

An alignment film is formed on the passivation film 42 to complete the lower plate. And, the upper glass substrate 102 where the color filter, the black matrix, the common electrode, the alignment film and the like are formed is bonded to the lower plate with a sealant. Lastly, the gate drive IC 108 and the data drive IC 110 are joined to the non-display surface of the lower glass substrate 104 with the ACF 100 in use of the COG process.

The COG process includes a process of temporarily pressing the ACF 100 onto the lower glass substrate 104; and a process of permanently pressing the gate drive IC 108 and the data drive IC 110 onto the ACF 100 in use of the heat pressure process.

The temporary pressure process broadly joins the ACF 100 onto the dummy pad group 120 and to where the gate drive IC 108 and data drive IC 110 will be heat-pressed, and then temporarily pressing the ACF 100 thereonto. The ACF 100 may be covered by a protection sheet. The location may be in the non-display surface 10 of the edge of the lower glass substrate 104 which is not overlapped with the upper glass substrate 102.

The permanent pressure process peels off the protection sheet from the ACF 100 after cutting the ACF 100 covered by the protection sheet, and then aligns output bumps of the drive ICs 108, 110 to the data pads DP and aligns input bumps of the drive ICs 108, 110 to the FPC connection pads. And, the permanent pressure process applies heat to the ACF 100 by a heat pressure process using a bonding head and simultaneously press the drive ICs 108, 110 onto the lower glass substrate 104, thereby completely bonding the drive ICs 108, 110 onto the lower glass substrate 104.

In such a COG process, the ACF and the source/drain metal have a strong adhesive strength, thus both sides of the ACF are firmly adhered to the dummy pad group 120 formed of the source drain metal. Accordingly, the AFC is not easily peeled off and is stably disposed in the joint part of the drive ICs 108 and 110 when peeling off the protection sheet which covers the ACF.

As described above, the liquid crystal display device and the fabricating method thereof according to the embodiment of the present invention forms the dummy pads of the metal, which has an excellent adhesive strength with the ACF, at both sides of the gate and data drive ICs and prevents the joint defect of the ACF in the COG process, thus it is possible to stabilize the joining of the drive ICs.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A fabricating method of a liquid crystal display device, comprising the steps of:
   forming a plurality of gate lines on a substrate;
   forming an insulating layer on the gate lines;
   simultaneously forming a plurality of data lines and first dummy pads on the insulating layer, wherein the data lines cross the gate lines, and wherein the first dummy pads are on both sides of where a data drive circuit will be pressed;
   forming a passivation layer on the insulating layer including the data lines and the first dummy pads and completely removing the insulating layer from the first dummy pads;
   joining a first anisotropic conductive film to the first dummy pads and to where the data drive circuit will be pressed; and
   heat-pressing the data drive circuit, which supplies data voltages to the data lines, onto the first anisotropic conductive film.

2. The fabricating method according to claim 1, further comprising the steps of:
   forming second dummy pads on the insulating layer, wherein the second dummy pads are on both sides of where a gate drive circuit will be pressed;
   joining a second anisotropic conductive film to the second dummy pads and to where the data drive circuit will be pressed; and
   heat-pressing the gate drive circuit, which supplies scan pulses to the gate lines, onto the second anisotropic conductive film.

3. The fabricating method according to claim 1 or 2, wherein the dummy pads include the same metal as the data line.

4. The fabricating method according to claim 1 or 2, wherein the dummy pads include at least any one of molybdenum Mo, titanium Ti and tantalum Ta.

5. The fabricating method according to claim 1 or 2, wherein a height of the dummy pads is not less than a height of the anisotropic conductive film.

* * * * *